United States Patent
Kimball et al.

(10) Patent No.: US 7,084,408 B1
(45) Date of Patent: Aug. 1, 2006

(54) VAPORIZATION AND IONIZATION OF METALS FOR USE IN SEMICONDUCTOR PROCESSING

(75) Inventors: James Kimball, San Jose, CA (US); Sheldon Aronowitz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 400 days.

(21) Appl. No.: 10/697,507

(22) Filed: Oct. 29, 2003
(Under 37 CFR 1.47)

(51) Int. Cl.
*H01J 27/00* (2006.01)
*H01J 37/08* (2006.01)
*G21K 5/10* (2006.01)

(52) U.S. Cl. .................. 250/424; 250/425; 250/492.21
(58) Field of Classification Search ................ 250/425, 250/492.21
See application file for complete search history.

(56) References Cited

U.S. PATENT DOCUMENTS

| | | | |
|---|---|---|---|
| 3,968,270 A | 7/1976 | Hasegawa | |
| 4,229,260 A | 10/1980 | Johnson et al. | |
| 4,617,203 A * | 10/1986 | Jergenson | 427/294 |
| 4,742,022 A | 5/1988 | Oren et al. | |
| 4,833,319 A * | 5/1989 | Knauer | 250/251 |
| 4,911,351 A | 3/1990 | Ishikawa et al. | |
| 5,315,121 A * | 5/1994 | Kluge et al. | 250/423 R |
| 5,333,495 A * | 8/1994 | Yamaguchi et al. | 73/105 |
| 6,200,397 B1 | 3/2001 | Allen | |
| 6,387,182 B1 | 5/2002 | Horie et al. | |
| 6,416,862 B1 | 7/2002 | Kogoi et al. | |
| 2003/0015657 A1 * | 1/2003 | Takada et al. | 250/288 |

* cited by examiner

*Primary Examiner*—John R. Lee
*Assistant Examiner*—Jennifer Yantorno
(74) *Attorney, Agent, or Firm*—Beyer Weaver & Thomas, LLP

(57) ABSTRACT

Techniques for vaporizing and handling a vaporized metallic element or metallic element salt with a heated inert carrier gas for further processing. The vaporized metallic element or salt is carried by an inert carrier gas heated to the same temperature as the vaporizing temperature to a heated processing chamber. The metal or salt vapor may be ionized (and implanted) or deposited on substrates. Apparatus for accomplishing these techniques, which include carrier gas heating chambers and heated processing chambers are also provided.

23 Claims, 5 Drawing Sheets

VAPORIZATION AND IONIZATION OF METALS FOR USE IN SEMICONDUCTOR PROCESSING

BACKGROUND

1. Field of the Invention

The present invention generally relates to apparatus and techniques for vaporizing metallic elements or salts and further temperature controlled handling and processing of the metal or metal salt vapors for use in material processing operations, for example, semiconductor processing. The further processing may include ionization for possible subsequent ion implantation, or participation in a deposition process.

2. Description of Related Art

A variety of techniques and apparatuses are known for modifying or coating substrates to form new compositions. For example, ion implantation is used to implant ions into substrates to create new materials. Also, deposition processes, such chemical vapor deposition (CVD) and physical vapor deposition (PVD or sputtering) are well known to practitioners of materials science, for example, in the semiconductor processing arts, for depositing layers of different materials on substrates.

Such techniques and the resulting compositions have proven useful in the semiconductor processing arts for a variety of purposes. For example, ion implantation has been used to dope semiconductor substrates and CVD and PVD processes have been used to deposit polysilicon or barrier layer materials. With continued miniaturization of integrated circuits, new materials and processing techniques with improved performance characteristics in smaller device size realms are constantly being sought.

Accordingly, techniques and apparatuses for the fabrication of new materials with uses in semiconductor processing are desirable. Also, techniques and apparatuses with improved process control enabling the more precise tailoring of a material for particular purpose would be desirable. Such apparatuses and techniques would find use in the semiconductor processing context and beyond.

SUMMARY OF THE INVENTION

The present invention provides techniques for vaporizing a metallic element or metallic element salt with a heated inert carrier gas and further temperature controlled handling and processing of the metal or metal salt vapors for use in material processing operations, for example, semiconductor processing.

The vaporized metallic element or salt is then transported to a temperature controlled ionization chamber where the vaporized metal or salts are ionized to generate metal ions. The metal ions may be extracted from the ionization chamber as an ion beam for use in materials processing operations, such as ion implantation in a semiconductor device fabrication process. Apparatus for accomplishing these techniques, which include vaporizing chambers with carrier gas heating capability and heated ionization chambers are also provided.

Suitable metallic elements include alkaline earth elements (Group II metals) or any metallic element or salt with relatively high vapor pressure (e.g., at least 5 mTorr) at relatively low temperature (e.g., less than about 1000° C.), for example, alkaline earth elements (Group II metals) such as Ca, Ba or Sr. Certain transition metals, such as transition metals with vapor pressures greater than 0.01 mTorr at temperatures below 1000° C., (e.g., Cd, Zn or Mn), or certain metal salts (e.g., $CaCl_2$, $CaBr_2$, $NbCl_5$, or $ZrCl_4$) may be used in various aspects of the invention.

In one aspect, the invention pertains to a method of generating an metallic ion source. The method involves heating an inert carrier gas, vaporizing a metallic element or metallic element salt in the presence of the heated inert carrier gas, transporting the vaporized metallic element or salt in the heated inert carrier gas to a temperature-controlled ionization chamber, and ionizing the vaporized metallic element or salt in the chamber in the presence of the heated inert carrier gas to generate ions of the metal.

In another aspect, the invention pertains to an apparatus for vaporizing and ionizing a metallic element or metallic element salt. The apparatus includes a carrier gas heating chamber configured to heat an inert carrier gas to a temperature in the range of 100 to 1000° C., and a vaporizer chamber, connected with the carrier gas heating chamber, and configured to vaporize a metallic element in the presence of the inert carrier gas heated in the carrier gas heating chamber. An ionization chamber is connected with the vaporizer chamber, the ionization chamber having surfaces heated to prevent deposition of the vaporized metallic element or salt thereon, and configured to ionize the vaporized metallic element in the presence of the inert carrier gas heated in the carrier gas. The ionization chamber surfaces may contain or contact resistive heating elements. A photoionization source may be appended to the ionization chamber. The interior surfaces of the ionization chamber have a mirror finish.

These and other aspects and advantages of the present invention are described below where reference to the drawings is made.

BRIEF DESCRIPTION OF THE DRAWINGS

It is to be understood that, in the drawings, like reference numerals designate like structural elements. Also, it is to be understood that the depictions in the figures are not necessarily to scale.

DETAILED DESCRIPTION OF SPECIFIC EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Introduction

The present invention provides techniques for vaporizing a metallic element or metallic element salt with a heated inert (i.e., noble or rare) carrier gas and further temperature controlled handling and processing of the metal or metal salt vapors for use in material processing operations, for example, semiconductor processing.

In one embodiment, the vaporized metallic element or salt can be applied to the substrate by deposition to form composites, for example with very thin metal or metal salt coatings. Apparatus for accomplishing these techniques, which include vaporizing chambers with carrier gas heating capability and heated deposition chambers are also provided.

In another embodiment, the vaporized metallic element or salt is then transported to a temperature controlled ionization chamber where the vaporized metal or salts are ionized to generate metal ions. The metal ions may be extracted from the ionization chamber as an ion beam for use in materials processing operations, such as ion implantation or plasma immersion (PLAD) in a semiconductor device fabrication process. Apparatus for accomplishing these techniques, which include vaporizing chambers with carrier gas heating capability and heated ionization chambers are also provided.

Figure 1:
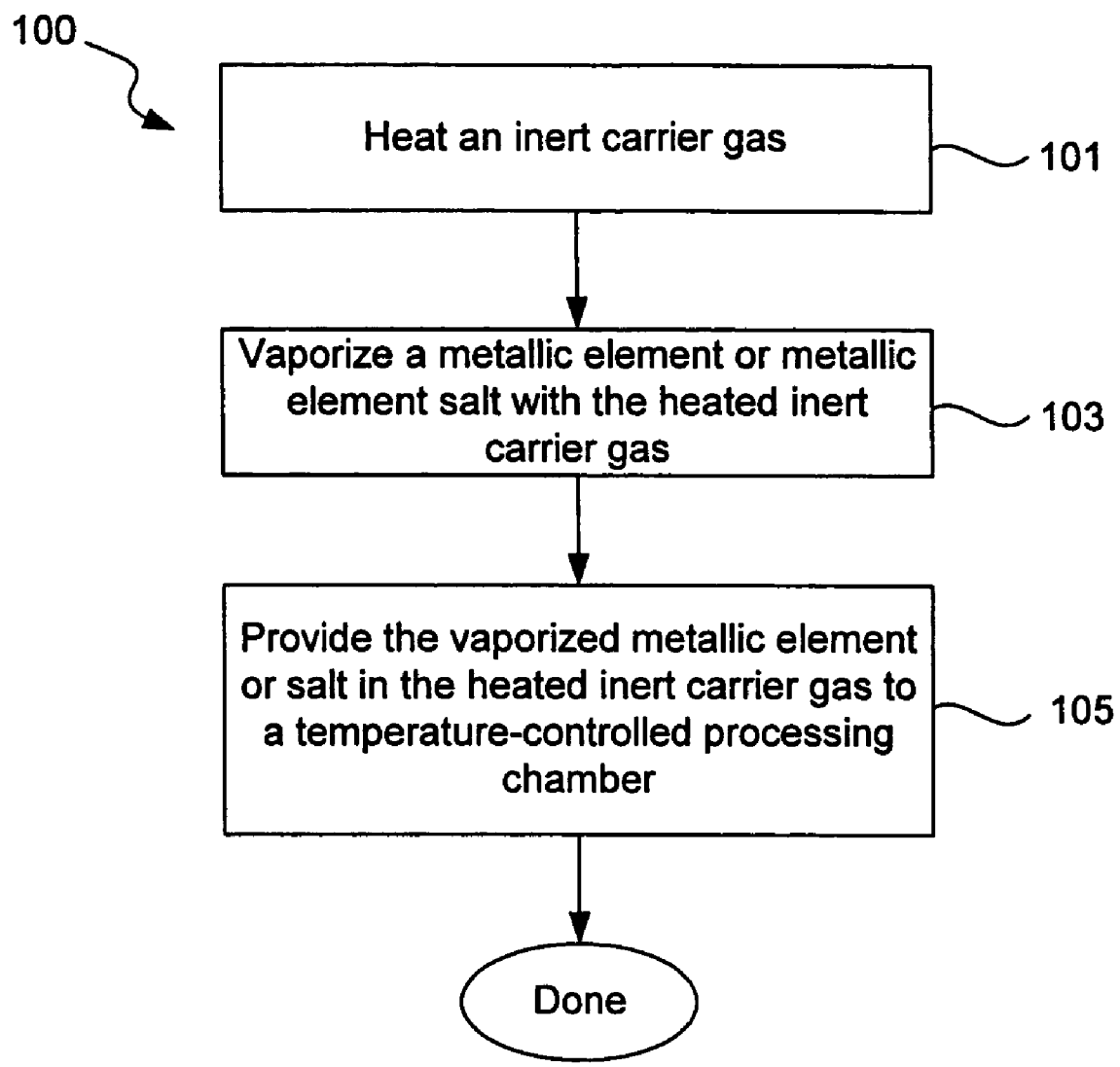
FIG. 1 is a flowchart of a generic method of vaporizing and handling a metallic element or salt in accordance with the present invention.

FIG. 1 is a flowchart of a generic method of vaporizing a composition by applying a vaporized metallic element to a substrate in accordance with one embodiment of the present invention. The method (100) involves heating an inert carrier gas (101), for example to a temperature sufficient to produce a vapor pressure of the metallic element or salt of at least 0.01 mTorr, such as between about 100 and 1000° C., and vaporizing the metallic element or metallic element salt with the heated inert carrier gas (103). The vaporization of the metal or salt could include heating the metallic element or metallic element salt to the same temperature as the heated inert carrier gas, such as in a crucible, for example. The result is a vaporized metallic element or salt together with the heated inert carrier gas. The vaporized metallic element or salt in the presence of the heated carrier gas may then be handled, for example transported, by the heated carrier gas which retains it in the vapor phase during handling. In this way, the vaporized metallic element or salt is then provided to a temperature-controlled chamber (105), which may be heated to about the same temperature as the carrier gas or may use the heated carrier gas to maintain a sufficiently high temperature that deposition on the walls of the chamber is suppressed. In a preferred embodiment, the chamber sidewalls are heated, preferably resistively by resistive heating elements embedded in or applied to the chamber sidewalls.

Suitable metallic elements include alkaline earth elements (Group II metals) or any metallic element or salt with relatively high vapor pressure (e.g., at least 5 mTorr) at relatively low temperature (e.g., less than about 1000° C.), for example, alkaline earth elements (Group II metals) such as Ca, Ba or Sr. Certain transition metals, such as transition metals with vapor pressures greater than 0.01 mTorr at temperatures below 1000° C., (e.g., Cd, Zn or Mn), or certain metal salts (e.g., $CaCl_2$, $CaBr_2$, $NbCl_5$, or $ZrCl_4$) may be used in various aspects of the invention.

The metals or metal salts are vaporized in accordance with the present invention in the presence of a heated inert carrier gas, such as Ar or Ne. The carrier gas is heated to a temperature sufficient to vaporize and retain in the vapor state enough of the metal or salt for the desired application purpose. One of the advantages of the present invention is that metal or metal salt vapor pressures sufficient for well controlled deposition of thin films (e.g., as thin as one atom thick) or relatively shallow concentrated implants may be achieved at relatively low temperatures, for examples temperatures below 1000° C.

Apparatus for accomplishing these techniques include carrier gas heating chambers, vaporizers and heated processing chambers, including, in various embodiments, ionization and deposition chambers. In the case of ionization, the apparatus includes a component for ionizing the metallic vapors without causing shorting of the system due to byproduct metal deposition. In the case of deposition, the apparatus includes a component for cooling substrate in the substrate holder in order to induce deposition and solidification of the metal or metal salt vapors on the substrate.

Ionization

Figure 2:
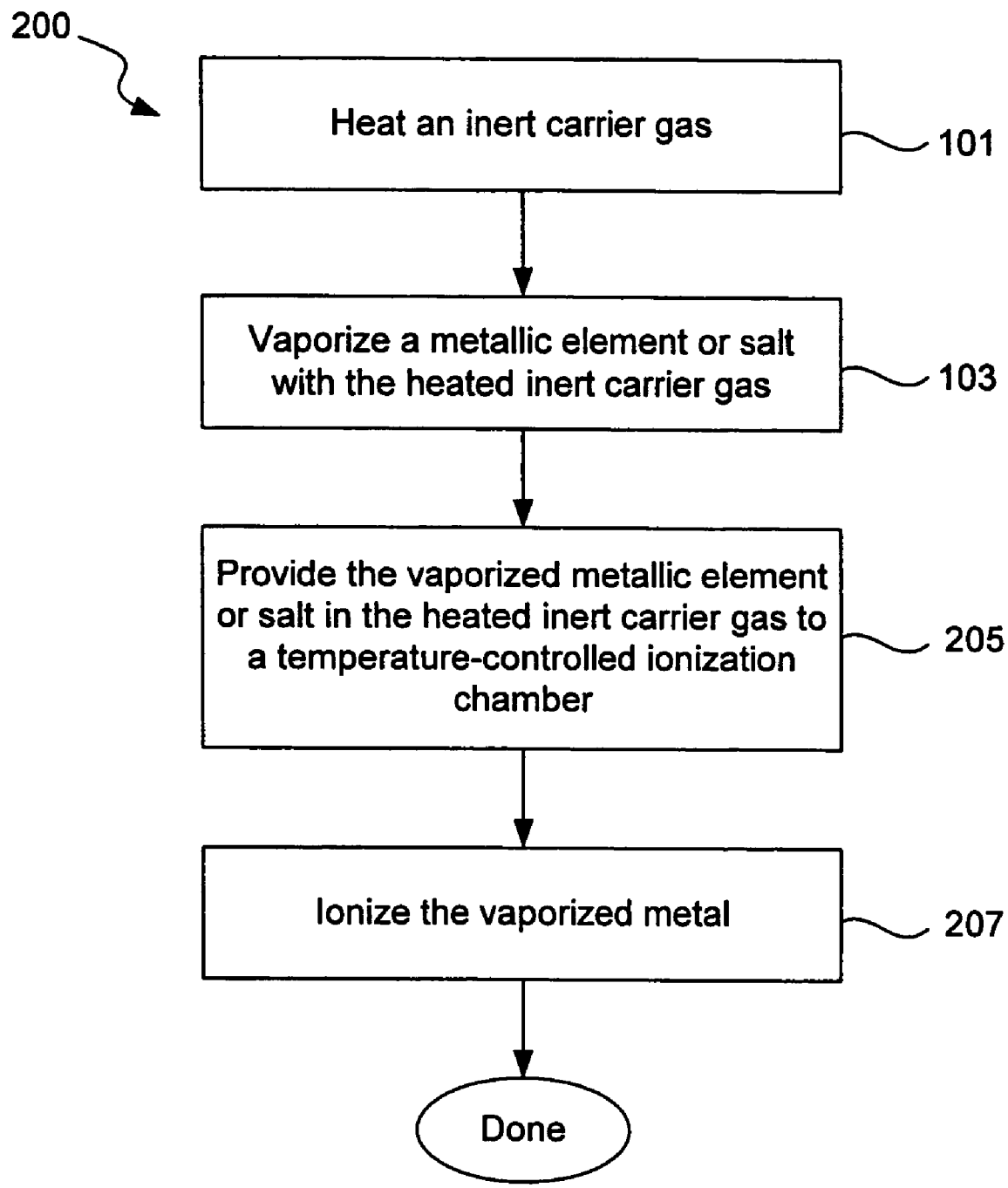
FIG. 2 is flowchart of a method of vaporizing a metallic element or salt, and handling and ionizing a vaporized metallic element in accordance with the present invention.

In one aspect of the preset invention, vaporized metals may further be ionized and the ions then used in an ion implantation process to create a new material. FIG. 2 of a method of vaporizing a metallic element or salt, and handling and ionizing a vaporized metallic element in accordance with the present invention. The method (200) involves heating an inert carrier gas (101), for example to a temperature at or above the vaporization temperature of a metal or metal salt, for example between about 100 and 1000° C., and vaporizing a metallic element or metallic element salt in the presence of the heated inert carrier gas (103). The vaporized metallic element or salt in the heated inert carrier gas is then provided to a temperature-controlled ionization chamber (205).

Next, the vaporized metal is ionized (207). Ionization chambers normally ionize material by means of thermoionic emission sources and high voltages, e.g., a filament, cathode, and anode. However, these sources are susceptible to shorting due to metal deposition from the gaseous mixture onto electrical components. In accordance with the present invention, the ionization is conducted by a process that is not susceptible to shorting due to deposition of metal on its components. Also, since the metal or metal salt vapor is conveyed by a carrier gas, the technique should ionize the metal in the vapor without ionizing the carrier gas. In a specific embodiment, photo-ionization is used. Microwave and laser sources, which ionize gaseous material, are known and can be used. Also, electron cyclotron resonance sources used in the nuclear industry for very heavy ions (CERN) may be used. Both of these methods can be considered special cases of photo-ionization. By careful selection of wavelengths, selective ionization can occur.

In a specific embodiment, the photo-ionization is conducted with a bright light source having a wavelength sufficient to ionize the metallic element but not the inert carrier gas. The ionization energy relates to photo-ionization according to the following relationship wavelength=12398/E(eV) in units of angstroms (Å). As an example, Ca will be selectively ionized and Ne will not be ionized by light having a wavelength(s) in the range of 600 to 2028 Å (e.g., about of about 600 to 2100 Å). The light source can be filtered to remove wavelengths low enough to ionize the inert carrier gas, for example, of less than about 619 Å.

An ion beam can be extracted from the chamber using an extractive electrode assembly to generate an ion beam. The extraction electrode assembly should be very close to the chamber and extract only the metal ions. Unionized metal and the carrier gas are removed from the chamber. The ion beam may be subjected to a magnetic mass analysis and any required acceleration/deceleration for obtaining the desired energy for subsequent applications. When selective ionization is performed, such as in the case of Ca in a Ne carrier gas as described above, no mass analysis is required and the ion beam can go directly to the substrate. Mass analysis may still be performed if a change in energy from the extraction potential is desired.

Following ionization, the ion beam generated may be applied to a substrate to implant metal ions into the substrate. The substrate may be composed of organic or inorganic materials or a combination. A particularly useful substrate in the context of semiconductor processing is silicon or a metal oxide dielectric material, such as $SiO_2$, $ZrO_2$ or $HfO_2$. In specific embodiments, the ionized metallic element is Ca, Sr, Ba, Mn, Cd, or Zn, and the substrate is $SiO_2$, ZnO or $HfO_2$. In a preferred embodiment, the ionized metallic element is Ca and the substrate is $SiO_2$.

The metal ions are applied to a substrate in an ion implantation chamber via the ion beam extracted from the ionization chamber. Such chambers are well know in the art, for example the Axcelis GSD ion implantation system available from Axcelis Technologies, Beverley, Mass. Other suitable ion implanters are available from Varian, Inc. and Applied Materials, Inc. Pressures in the ionization chamber are less than 500 mTorr, and as low as 8E-7 Torr. Actual pressures may vary over a large range, depending on the application.

Implant energies are a function of the extraction potential or substrate potential. Energies of ion beams can vary depending on the mechanism for extraction but could be as low as 10 eV and high as 20 MeV. The ion source could be attached as a source to any number of implantation configurations. Other than those parameters specifically noted, standard ion implantation techniques, known to those of skill in the art, may be used.

Ion implantation in accordance with the present invention may be used to fabricate new materials with beneficial properties. For example, for a 2 KV extraction a composition with a Ca implant peak around 45 Å deep in $SiO_2$ can be produced. For a low energy implantation system, an energy of 200 eV would produce a Ca peak around 13 Å deep in $SiO_2$. A concentration of about 8–10 atomic percent can be achieved with doses in range the range of about $1E15/cm^2$ to $1E17/cm^2$. Also, by implanting Hf at 200 eV into a $SiO_2$ substrate, an implanted layer of about 40 Å depth is created. The implant is characterized by a maximum concentration of the metal located about 22 Å into the oxide substrate with a straggle (analogous to one standard deviation for the metal distribution) of about 6 Å. Hence, for an implant dose of $1E12/cm^2$, a peak concentration of about $6.6E18$ atoms/$cm^3$ would be created within the oxide layer. Such materials may be useful in semiconductor processing, for example as a barrier layer (for example a barrier to B) or dielectric.

Figure 3:
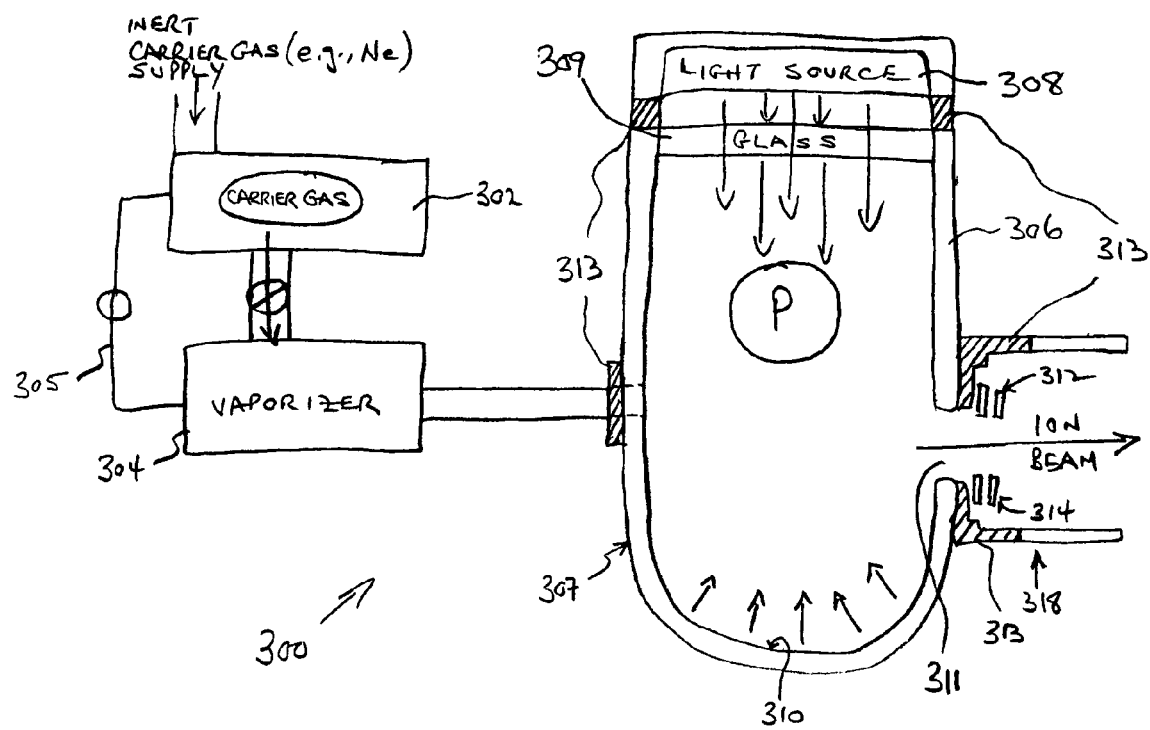
FIG. 3 is a block diagram of an apparatus for conducting vaporization, handling and ionization in accordance with the present invention.

FIG. 3 is a block diagram of an apparatus for conducting vaporization, handling and ionization in accordance with the present invention. The apparatus may, for example, be a rapid thermal anneal (RTA) reactor adapted to the purposes of the present invention. An apparatus 300 in accordance with the present invention includes a carrier gas heating chamber 302 configured to heat an inert carrier gas to a temperature at or above the vaporization temperature of a particular metallic element or salt, generally in the range of about 100 to 1000° C. An inert carrier gas is supplied to the heating chamber 302 via an inlet 301. For ionization implementations, a carrier gas that is not readily ionized by a photo-ionization process, for example neon (Ne), is used. The carrier gas heating chamber 302 is connected with a metal vaporizer chamber 304. The vaporizer 304 is configured to vaporize a metallic element in the presence of the inert carrier gas heated in the carrier gas heating chamber 302. The vaporizer 304 may include a resistive heater and crucible to facilitate vaporization of the metal or salt. The heated carrier gas in the heating chamber 302 is maintained at the same temperature as the vaporizer 304 by a control feedback loop 305. After vaporization, the vaporized metal or salt is held in the vapor state by the heated carrier gas for handling, for example, transport to a another chamber for use in materials processing operations.

In one embodiment, depicted in FIG. 3, the vaporizer chamber 304 is connected with a temperature controlled (i.e., heated) ionization chamber 306. The ionization chamber 306, and its surfaces are heated to discourage deposition of the vaporized metallic element on them. The chamber surfaces may be heated by resistive heating elements applied to or embedded in the chamber's walls 307 and/or, at least in part, by the heated carrier gas itself. The chamber 306 is maintained at a suitable temperature to maintain the vapor state of the metal or salt and pressure for ionization, e.g., about 100 to 1000° C. and a moderate pressure of less that about 500 mTorr and as low as 8E-7 Torr.

The vaporized metal or salt is conveyed from the vaporizer 304 to the ionization chamber 306 by the heated carrier gas via an inlet 308. The ionization chamber 306 ionizes the metal or metal salt vapor by a photo-ionization process. The ionization chamber has an appended a light source 308, as described above, separated from the carrier gas and vapor in the chamber by a transparent sheet 309, generally composed of glass. The light from the source 308 passes through the glass 309 and ionizes the metal vapor without ionizing the carrier gas. The light source may be filtered to remove wavelengths undesirable wavelengths, such as those low enough to ionize the carrier gas.

As noted above, any surface inside the chamber 306 exposed to the gas and vapor where deposition is undesirable is heated to a temperature at or above the vaporization temperature of the metal or salt to discourage deposition. In this regard, the glass 309 separating the light source 308 from the gas and metal vapor is heated by the bright light source and by thermal conduction from its contact with the heated chamber walls 307.

The chamber 306 may have mirrored interior surfaces 310 to reflect light and increase ionization efficiency. Further in this regard, the glass 309 separating the light source from the gas and metal vapor is preferably one way mirrored glass to reflect light back into the ionization chamber.

An ion beam is extracted from the chamber using an extraction electrode assembly 318 to generate an ion beam. This is facilitated by biasing the ionization chamber sidewalls 307 with a positive voltage potential (e.g., +15 kV). An extraction electrode 312 at the chamber outlet 311 is biased at a negative potential (e.g., −15 kV) and paired with a ground potential electrode 314. The extraction assembly is very close to the chamber 306 and will extract only the metal, e.g., Ca, ions. Unionized metal vapor and carrier gas, e.g., Ne, and any other non-metal ion materials, are pumped from the chamber 306 by pump line P. In a specific embodiment, the pump line P is located in the upper portion of the chamber to further discourage deposition of metal/salt vapor onto the glass plate 309 between the light source 308 and the chamber 306. The vaporizer 304, bright light source 308 and extraction assembly 318 are electrically isolated from the biased chamber sidewalls by an electrical insulator material 313.

The extracted ion beam may be subjected to a magnetic mass analysis and any required acceleration/deceleration for obtaining the desired energy for subsequent processing procedures, in particular, ion implantation. The remaining lenses and scanning system are those of any conventional ion implantation system.

Deposition

Figure 4:
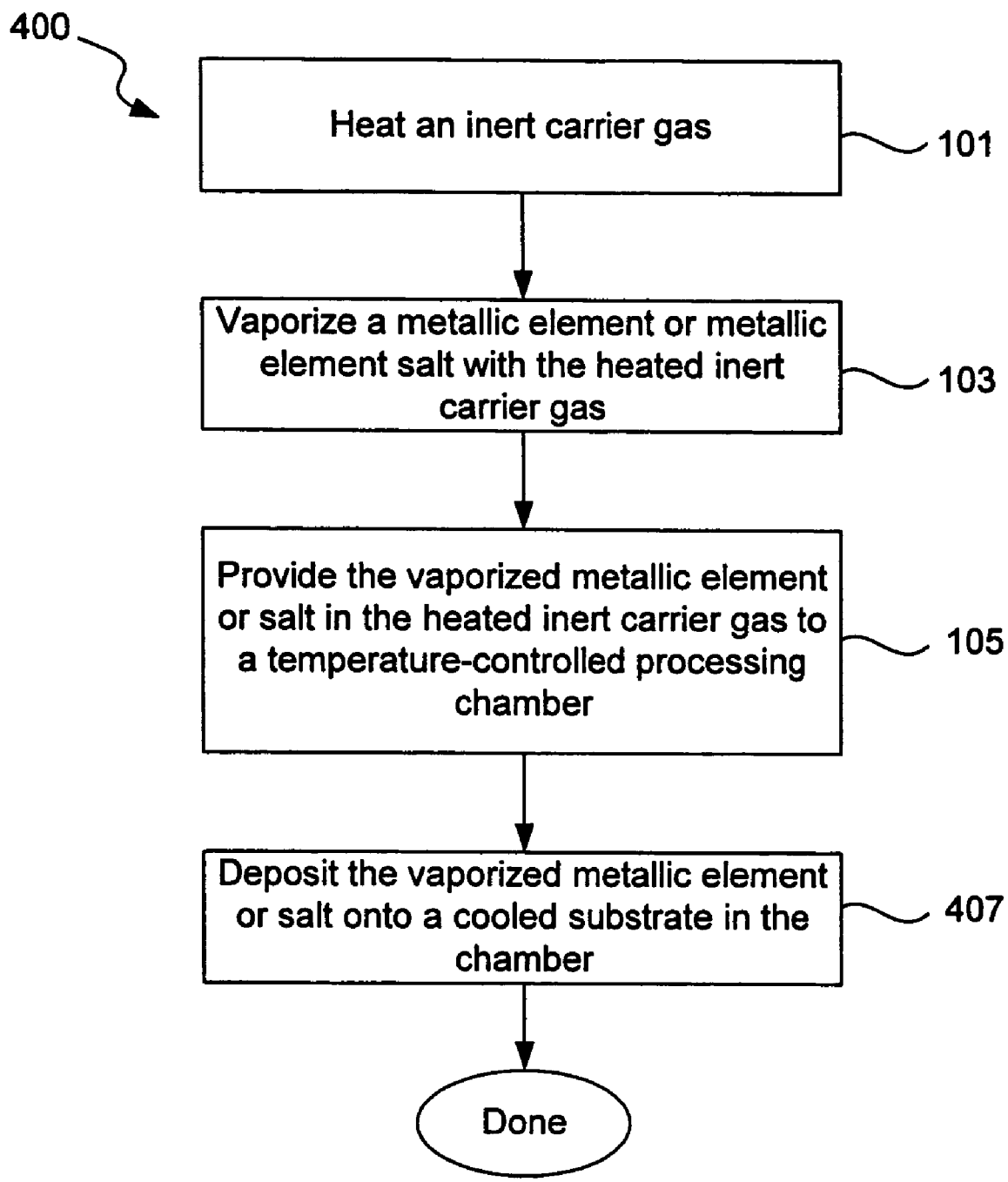
FIG. 4 is flowchart of a method of vaporizing a metallic element or salt, and handling and depositing a vaporized metallic element or salt on a substrate in accordance with the present invention.

In another aspect of the preset invention, vaporized metals may be deposited on a substrate to create a composite, such as may be useful as a barrier layer (for example a barrier to B) in semiconductor processing. FIG. 4 is flowchart of a method of vaporizing a metallic element or salt, and handling and depositing a vaporized metallic element or salt on a substrate in accordance with the present invention. The method (400) involves heating an inert carrier gas (101), for example to a temperature at or above the vaporization temperature of a metal or metal salt, for example between about 100 and 1000° C., and vaporizing a metallic element or metallic element salt in the presence of the heated inert carrier gas (103). The vaporized metallic element or salt in the heated inert carrier gas is then provided to a temperature-controlled deposition chamber (405) for application to a substrate. A chamber pressure of about 50 to 50,000 mTorr and a chamber temperature sufficient to prevent substantial deposition of metal, about 100 to 1000° C. for example, may be used. The metal is then deposited onto a cooled substrate in the chamber (407).

The method allows very controlled deposition on a surface of a very small number of atomic layers of a metal. The inert carrier and dilution gas can be the more economical (but more easily ionized) argon (Ar) since there is no ionization involved. The system, with respect to the carrier gas, is closed. The carrier gas and the metal whose vapors will be deposited are maintained at the same temperature through a suitable feed-back system. The heated carrier gas minimizes deposition on unwanted surfaces, and serves to control the deposition process by determining the flow rate and concentration of the metal vapor in the gas. For example, the vapor pressure of calcium (Ca) heated to 600° C. is about 10 mTorr. If the pressure of the argon is maintained at 10 Torr, then quantity of Ca would be 1 part Ca per 1000 Ar. The flow rate would determine the time required to achieved a desired deposition thickness. Increasing the argon pressure dilutes the calcium at a given flow rate. The combination of the carrier gas pressure and flow rate can be used to perform very controlled depositions.

The deposition takes place in chamber where the substrate to have metal deposited on it is cooled to below the vaporization temperature of the vaporized metal or salt by being in contact with a cooled (e.g., water-cooled) platform (substrate holder). The vapor solidifies on the cooled substrate surface to form a thin film. For example, the substrate may be cooled to a temperature of about 400° C. (the vapor pressure of the calcium, for example, at 400° C. is about one-thousandth of its vapor pressure at 600° C.).

In specific embodiments, the metallic element is Ca, Sr, Ba, Mn, Cd, or Zn. Alternatively, a metal salt, such as $CaCl_2$, $CaBr_2$, $NbCl_5$, or $ZrCl_4$ may be used. The substrate may be a metal oxide dielectric such as $SiO_2$, ZnO or $HfO_2$, or another suitable material such as silicon. In a preferred embodiment, the metallic element is Ca and the substrate is $SiO_2$.

Figure 5:
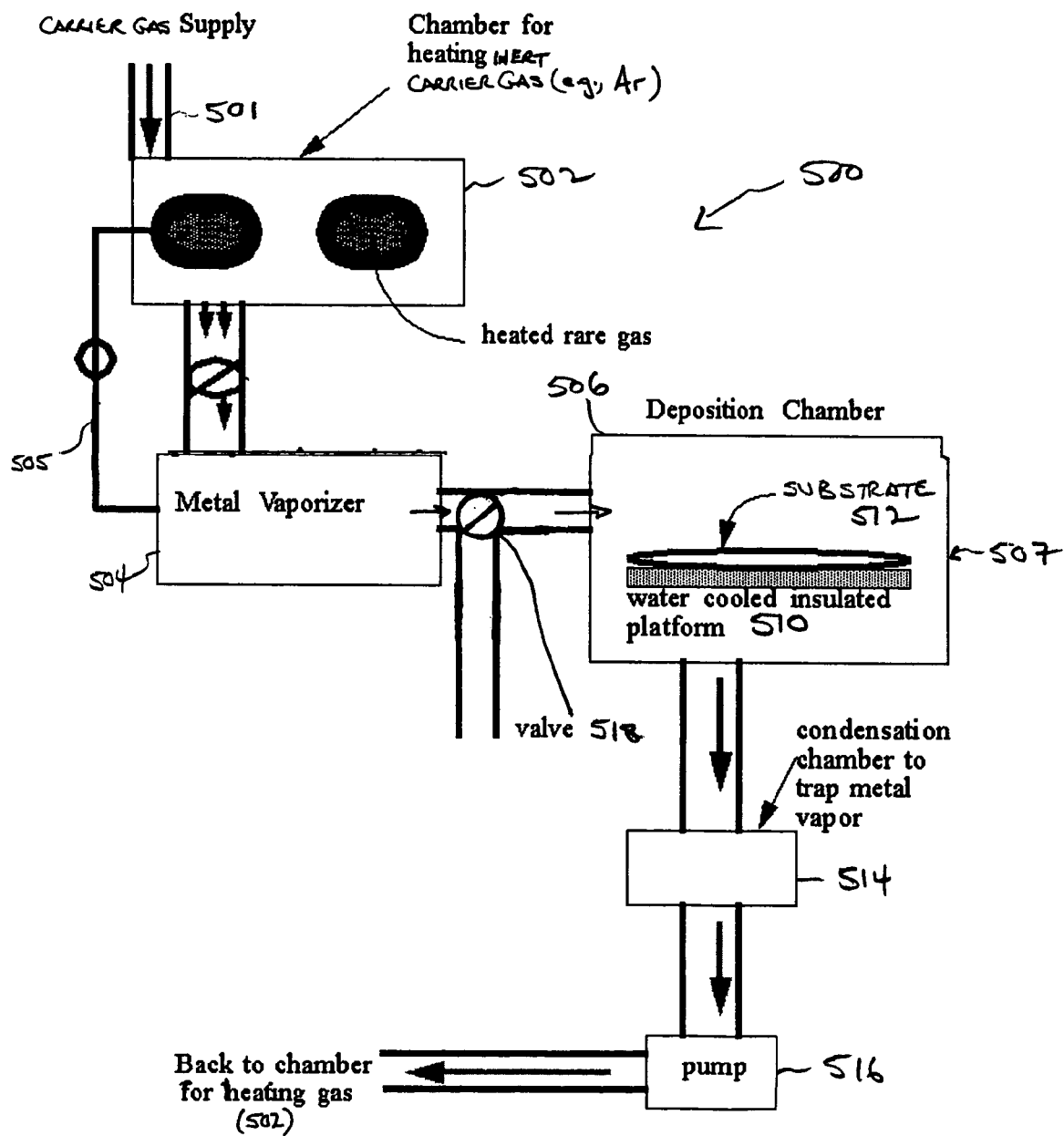
FIG. 5 is a block diagram of an apparatus for conducting vaporization, handling and deposition in accordance with the present invention.

FIG. 5 is a block diagram of an apparatus for conducting vaporization, handling and deposition in accordance with the present invention. The apparatus may, for example, be a rapid thermal anneal (RTA) reactor adapted to the purposes of the present invention. An apparatus 500 in accordance with the present invention includes a carrier gas heating chamber 502 configured to heat an inert carrier gas to a temperature at or above the vaporization temperature of a particular metallic element or salt, generally in the range of about 100 to 1000° C. An inert carrier gas, e.g., Ar, is supplied to the heating chamber 502 via an inlet 501. The carrier gas heating chamber 502 is connected with a metal vaporizer chamber 504. The vaporizer 504 is configured to vaporize a metallic element in the presence of the inert carrier gas heated in the carrier gas heating chamber 502. The vaporizer 504 may include a resistive heater and crucible to facilitate vaporization of the metal or salt. The heated carrier gas in the heating chamber 502 is maintained at the same temperature as the vaporizer 504 by a control feedback loop 505. After vaporization, the vaporized metal or salt is held in the vapor state by the heated carrier gas for handling, for example, transport to a another chamber for use in materials processing operations.

In one embodiment, depicted in FIG. 5, the vaporizer chamber 504 is connected with a temperature controlled deposition chamber 506 configured for application of the vaporized metallic element or salt to a substrate 512. The substrate 512 is held in a substrate holder 510. The deposition rate of metal on surfaces is controlled by maintaining the partial pressure of the metal vapor in the carrier gas and the temperature of these surfaces. Partial pressure is controlled by the carrier gas temperature, pressure, and flow. The deposition chamber 506, and its surfaces are heated to prevent deposition of the vaporized metallic element on them. The chamber surfaces may be heated by resistive heating elements applied to or embedded in the chamber's walls 507 and/or, at least in part, by the heated carrier gas itself. The chamber 506 is maintained at a suitable temperature and pressure for deposition, e.g., about 100 to 1000° C. and a moderate pressure of less that about 50 Torr.

The apparatus 500 also includes cooling apparatus to cool the substrate holder. For example, the substrate holder may be water cooled. Metal deposition on the substrate 512 occurs when the metal vapor cools and solidifies on the cooled substrate surface. Excess is metal vapor and carrier gas is pumped from the chamber 506 by a pump 516. Excess metal is removed in a condensation chamber 514 and the inert carrier gas (e.g., argon) is recycled back to the heating chamber 502.

In one embodiment, the carrier gas heating and metal vaporizer chambers of deposition and ionization apparatuses in accordance with the present invention may be shared. In this configuration, a valve 518 at the outlet of the vaporizer may be used to shunt the metal vapors to one or the other chamber (e.g., 306 or 506).

EXAMPLES

The following examples provide details concerning the vaporization, handling and ionization or deposition of metals in accordance with the present invention. It should be understood the following is representative only, and that the invention is not limited by the detail set forth in these examples:

Example 1

Ionization

Ca is ionized in a hot ambient gas mixture of Ne, which is not ionized. Ca is heated in a vaporizer to a temperature of about to 590 to 600° C. A vapor pressure of about 7 to 8 mTorr associated with Ca source material is generated. Hot Ne is the carrier gas through the vaporizor. The Ne/Ca gas mixture is flowed to a heated, highly reflective chamber at a temperature of about 590 to 600° C. with a bright light source. Surfaces in the chamber are heated to prevent deposition of material and can be heated with resistive elements around or embedded in the chamber walls. The vapor pressure of Ca in the chamber is at least 5 mTorr. The chamber has a mirror finish on its inner walls to reflect light and increase ionization efficiency. The light source is filtered to remove wavelengths <619Å. Ca will be ionized and Ne will not be ionized for light whose wavelength(s) is in the range of 2028 to 600 Å.

An ion beam is extracted from the chamber using an extractive electrode/suppression electrode assembly to generate an ion beam. The extraction electrode assembly extracts only the Ca ions. The un-ionized Ca and Ne are pumped from the chamber. The beam goes through a magnetic mass analysis and any required acceleration/deceleration for obtaining the desired energy.

Example 2

Deposition

Ca is vaporized in a hot ambient gas mixture of Ar. Ca is heated in a vaporizer to a temperature of about 580 to 590° C. A vapor pressure of about 5 mTorr associated with Ca source material is generated. Hot Ne is the carrier gas through the vaporizor. The Ne/Ca gas mixture is flowed to a heated chamber at a temperature of about 590° C. Surfaces in the chamber are heated to prevent deposition of material and can be heated with resistive elements around or embedded in the chamber walls. The vapor pressure of Ca in the chamber is at least 5 mTorr.

The vaporized Ca in Ar carrier is deposited on a $SiO_2$ dielectric layer on a semiconductor wafer substrate cooled to about 400° C. A very thin layer, as thin as one or a few atoms, of Ca is formed on the SiO2 substrate. Excess Ca and Ar are pumped from the chamber for collection and reuse.

Although illustrative embodiments and applications of this invention are shown and described herein, many variations and modifications are possible which remain within the concept, scope, and spirit of the invention, and these variations would become clear to those of ordinary skill in the art. Accordingly, the present embodiments are to be considered as illustrative and not restrictive, and the invention is not to be limited to the details given herein, but may be modified within the scope and equivalents of the appended claims.

The invention claimed is:

1. A method of generating a metallic ion source, comprising:
   heating an inert carrier gas;
   vaporizing a metallic element or metallic element salt in the presence of the heated inert carrier gas;
   transporting the vaporized metallic element or salt in the heated inert carrier gas to a temperature-controlled ionization chamber; and
   ionizing the vaporized metallic element or salt in the ionization chamber in the presence of the heated inert carrier gas to generate ions of the metal.

2. The method of claim 1, further comprising extracting an ion beam from the chamber.

3. The method of claim 1, wherein the carrier gas is heated to a temperature at which the vapor pressure of the metallic element or salt of at least 0.01 mTorr.

4. The method of claim 1, wherein the carrier gas is heated to a temperature at which the vapor pressure of the metallic element or salt of at least 5 mTorr.

5. The method of claim 3, wherein the carrier gas is heated to a temperature between about 100 and 1000° C.

6. The method of claim 3, wherein the ionization chamber is heated to about the same temperature as the carrier gas.

7. The method of claim 1, wherein the ionization chamber is heated at least in part by resistive heating elements in or on the chamber walls.

8. The method of claim 1, wherein the inert carrier gas is Ne.

9. The method of claim 7, wherein the metallic element or salt is selected from the group consisting of alkaline earth metals and transition metals with vapor pressures greater than 0.01 mTorr at temperatures below 1000° C., and salts thereof.

10. The method of claim 1, wherein the ionization is a photo-ionization.

11. The method of claim 10, wherein the photo-ionization is conducted with light having a wavelength of about 600 to 2100 Å.

12. The method of claim 11, wherein the carrier gas is not ionized.

13. The method of claim 2, further comprising conducted ion implantation of a substrate with the ion beam.

14. The method of claim 13, wherein the ion beam comprises ions of a metallic element is selected from the group consisting of Ca, Sr, Ba, Cd, Zn and Mn.

15. The method of claim 14, wherein the substrate is a material selected from the group consisting of silicon, $SiO_2$, $ZnO_2$ and $HfO_2$.

16. The method of claim 15, wherein the metallic element is Ca and the substrate is $SiO_2$.

17. An apparatus for vaporizing and ionizing a metallic element or metallic element salt, comprising:
   a carrier gas heating chamber configured to heat an inert carrier gas to a temperature in the range of 100 to 1000° C.;
   a vaporizer chamber, connected with the carrier gas heating chamber, and configured to vaporize a metallic element in the presence of the inert carrier gas heated in the carrier gas heating chamber; and
   an ionization chamber connected with the vaporizer chamber, the ionization chamber having surfaces heated to prevent deposition of the vaporized metallic element or salt thereon, and configured to ionize the vaporized metallic element in the presence of the inert carrier gas heated in the carrier gas.

18. The apparatus of claim 17, wherein the ionization chamber surfaces contain or contact resistive heating elements.

19. The apparatus of claim 18, further comprising a photo-ionization source appended to the ionization chamber.

20. The apparatus of claim 19, wherein interior surfaces of the ionization chamber have a mirror finish.

21. The apparatus of claim 20, wherein a sheet of glass separates the light source from the ionization chamber.

22. The apparatus of claim 21, wherein the sheet of glass comprises embedded resistive heating elements.

23. The apparatus of claim 22, wherein the sheet of glass has a one way mirrored surface facing the ionization chamber interior.

* * * * *